United States Patent [19]
Miyata et al.

[11] Patent Number: 5,327,000
[45] Date of Patent: Jul. 5, 1994

[54] SEMICONDUCTOR DEVICE INTERCONNECTED TO ANALOG IC DRIVEN BY HIGH VOLTAGE

[75] Inventors: Kazuaki Miyata; Masayuki Masuda, both of Hyogo, Japan

[73] Assignee: Mitsubishi Denki Kabushiki Kaisha, Tokyo, Japan

[21] Appl. No.: 913,683

[22] Filed: Jul. 14, 1992

[30] Foreign Application Priority Data

Jul. 16, 1991 [JP]  Japan .................................. 3-175249

[51] Int. Cl.⁵ ..................... H01L 27/02; H01L 29/10; H01L 29/78
[52] U.S. Cl. ..................................... 257/344; 257/367; 257/369; 257/371; 257/401; 257/408; 257/409
[58] Field of Search ............... 257/344, 367, 369, 371, 257/391, 392, 401, 408, 409

[56] References Cited

FOREIGN PATENT DOCUMENTS

| | | |
|---|---|---|
| 0189914 | 8/1986 | European Pat. Off. . |
| 0266768 | 5/1988 | European Pat. Off. . |
| 61-154156 | 7/1986 | Japan . |
| 3-6855 | 1/1991 | Japan .................................. 257/344 |

OTHER PUBLICATIONS

Yamaguchi et al., "Process and Device Design of a 1000-V MOS IC", IEEE Transactions on Electron Devices, vol. ED-29, No. 8 (Aug. 1982), pp. 1171-1178.

Primary Examiner—Ngan Ngo
Attorney, Agent, or Firm—Lowe, Price, LeBlanc & Becker

[57] ABSTRACT

In a MOS type LSI comprising an n channel-open-drain-transistor capable of connecting with an analog IC driven by a high voltage, a surge breakdown voltage and a drain breakdown voltage of the open-drain-transistor is increased, and hence the reliability is increased. An n channel-open-drain-transistor includes a ring-shaped gate electrode and a drain region. A drain region is surrounded by a gate electrode. Drain region includes an n⁻ region and an n⁺ region. An n channel MOS transistor includes a gate electrode and a drain region. Drain region includes an n⁻ region and an n⁺ region. An impurity concentration of n⁻ drain region of the n channel-open-drain-transistor is higher than an impurity concentration of n⁻ drain region of the n channel MOS transistor.

7 Claims, 23 Drawing Sheets

SEMICONDUCTOR DEVICE INTERCONNECTED TO ANALOG IC DRIVEN BY HIGH VOLTAGE

BACKGROUND OF THE INVENTION

1. Field of the Invention

The present invention relates generally to a semiconductor device such as a large scale integrated circuit device (LSI) and, more particularly, a semiconductor integrated circuit device having a field effect transistor driven by a low power supply voltage which can be interconnected to an analog IC (Integrated Circuit) (a linear IC) driven by a high power supply voltage. The present invention is particularly useful for a semiconductor device of a so-called CMOS (Complementary-Metal Oxide Semiconductor) type. The present invention also relates to a manufacturing method of such semiconductor devices.

2. Description of The Background Art

When the present invention is applied to an MOS type LSI which can be connected to an analog IC chip, the most preferable result can be obtained. The MOS type LSI has a logic circuit therein. FIG. 20 is a block diagram schematically showing an MOS type LSI connected to an analog IC. FIG. 21 is a plan view showing a planar arrangement of the MOS type LSI shown in FIG. 20. FIG. 22 is a sectional view taken along a line XXII—XXII in FIG. 21. A structure of a conventional MOS type LSI will be described hereinafter with reference to these figures.

Referring to FIG. 20, an MOS type LSI 100 is connected to an analog IC 200 with a pull up resistor R connected to a power supply voltage (12V) being interposed. MOS type LSI 100 has a pad 55 as a connecting terminal to analog IC 200. Pad 55 is connected to the drain of an n channel-open-drain-transistor 50. The n channel-open-drain-transistor is a transistor having a drain with an output terminal pad connected thereto. The gate of n channel-open-drain-transistor 50 receives a signal ("High" or "Low") from an internal logic circuit 80 through a CMOS inverter. The CMOS inverter is comprised of an n channel MOS transistor 60 and a p channel MOS transistor 70.

Referring to FIG. 21, n channel-open-drain-transistor 50 has a gate electrode 56, a source region 57 and a drain region 58. N channel MOS transistor 60 has a gate electrode 61, a source region 62 and a drain region 63. A p channel MOS transistor 70 has a gate electrode 71, a source region 72 and a drain region 73. Each transistor has a source region, a drain region and a gate electrode connected to an interconnection through contact holes ch.

Referring to FIG. 22, each of transistors 50, 60, 70 is formed in a p type silicon substrate 1. In p type silicon substrate 1, a p type well 2 and an n type well 3 are formed. n channel-open-drain-transistor 50 and n channel MOS transistor 60 are formed in p type well 2. p channel MOS transistor 70 is formed in n type well 3. p+ inversion preventing region 4 and a thick isolation oxide film 5 thereon are formed in order to electrically isolate transistors 50, 60, 70 from each other. A gate electrode of each of transistors is formed of a polycrystalline silicon layer 7 and a molybdenum silicon layer 8. Polycrystalline silicon layer 7 is formed on the surface of p type well 2 or n type well 3 with a gate oxide film 6 interposed. Source/drain regions of n channel-open-drain-transistor 50 and n channel MOS transistor 60 are comprised of an n− source/drain region 9 and an n+ source/drain region 10. A source/drain region of p channel MOS transistor 70 is comprised of a p+ source/drain region 22. An interlayer insulating layer 11 is formed to cover each of transistors 50, 60, 70. An interconnection layer 12 is provided to be in contact with each of the source/drain regions through each of the contact hole formed in interlayer insulating film 11.

An MOS type LSI structured as mentioned above will be described. Referring to FIG. 20, when a signal output from internal logic circuit 80 through a CMOS inverter is "High", a high voltage is applied to the gate of n channel-open-drain-transistor 50. At this time, n channel-open-drain-transistor 50 is turned on. Current flows from pad 55 to the drain of n channel-open-drain-transistor 50. At this time, a power supply voltage (12V) is distributed correspondingly to values of pull up resistor R and a resistor r of n channel-open-drain-transistor and transmitted to analog IC.

Conversely, when the signal output from internal logic circuit 80 through the CMOS inverter is "low", a low voltage is applied to the gate of n channel-open-drain-transistor 50, so that n channel-open-drain-transistor 50 is turned off. Current does not flow from pad 55 to the drain of n channel-open-drain-transistor 50. As a result, power supply voltage (12V) is transmitted to analog IC 200.

As described above, a drain breakdown voltage of n channel-open-drain-transistor 50 should be over 12V.

FIG. 25 includes a partial plan view (A) showing an enlargement of n channel-open-drain-transistor 50 or n channel MOS transistor 60, and a partial sectional view (B) showing a section taken along line B—B of the partial plan view (A). With reference to FIG. 25(A), drain region 58 (63) has an n+ impurity diffusion region 58a (63a) with its boundary region extended slightly outward as indicated by a dotted line. Therefore, n+ impurity diffusion region 58a (63a) overlaps with p+ inversion preventing region 4 as shown in FIG. 25(B). As a result, a drain breakdown voltage is reduced and determined by the overlapped portion.

In a conventional MOS type LSI, as shown in FIG. 22, n channel MOS transistor 60 connected to internal logic circuit 80 and n channel-open-drain-transistor 50 connected to pad 55 have the same structure. That is, n channel-open-drain-transistor 50 is structured to be driven by a power supply voltage of 5V, as n channel MOS transistor 60. This results in a problem that only a small margin in breakdown voltage specification is allowed for n channel-open-drain-transistor 50. For example, a surge breakdown voltage which is measured by capacitor charging method (one type of a surge breakdown testing method) on condition of 200 pF and 0Ω cannot reach ±300V or more.

FIG. 24 is a enlarged partial sectional view showing one portion of n channel MOS transistor 50 or 60. Polycrystalline silicon layer 7 and molybdenum silicide layer 8 are formed on gate oxide film 6. An oxide film 20 is formed on sidewalls of polycrystalline silicon layer 7 and molybdenum silicide layer 8 forming a gate electrode. Under a sidewall oxide film 20, n− source/drain region 9 is formed. N+ source/drain region 10 is formed to connect with n− source/drain region 9. In the structure shown in FIG. 24, sidewall oxide film 20 is formed of a film having fine step coverage such as a TEOS film (a silicon oxide film formed by a CVD method using Tetra-Ethyl-Ortho-Silicate as raw material). The TEOS film, however, has the property of holding a high density of trapped carriers therein, so that a problem exists that the aforementioned surge breakdown voltage of the n channel-open-drain-transistor decreases more.

Furthermore, the gate electrode has a two-layer structure comprised of polycrystalline silicon layer 7 and a molybdenum silicide layer 8. Because of a difference of etching speeds for the polycrystalline silicon layer and the molybdenum silicide layer, a side portion of polycrystalline silicon layer 7a forming a lower layer is frequently etched to a greater degree than molybdenum silicide layer 8 of an upper layer as shown in FIG. 23. Polycrystalline silicon layer 7a is, so-called, side-etched. Then, the surge breakdown voltage decreases even more.

N channel-open-drain-transistor 50 has a drain connected to pad 55. Pad 55 is connected to external analog IC 200 which is different from MOS type LSI 100. An external surge is directly applied through pad 55 to the drain of n channel-open-drain-transistor 50. Therefore, a surge breakdown voltage of n channel-open-drain-transistor 50 should be higher than a breakdown voltage of n channel MOS transistor 60 constituting the CMOS inverter or the n channel MOS transistor constituting internal logic circuit 80. However, each of the n channel MOS transistors constituting MOS type LSI 100 is formed on the same p type silicon substrate 1, that is, the same p type well 2. As a result, all n channel MOS transistors including n channel-open-drain-transistor 50 have the same breakdown voltage specification.

As a degree of integration of a semiconductor integrated circuit device becomes higher, transistors constituting internal logic circuit 80 are more and more miniaturized. Channel lengths of the miniaturized MOS transistors are becoming shorter. In order to obtain a predetermined drain breakdown voltage in an MOS transistor having such a short channel length, the MOS transistor has an LDD structure. For example, as shown in FIG. 22, n channel MOS transistor 50 or 60 has an LDD structure formed of n⁻ source/drain region 9 and n⁺ source/drain region 10 as a source or a drain region. Also, as a measure to prevent a harmful effect by hot electrons generated in a field effect transistor having a short channel length, an impurity concentration of n⁻ source/drain region 9 is restricted to a low value. Under the circumstances, a problem exists that it is difficult for a drain breakdown voltage and a surge breakdown voltage of an n channel-open-drain-transistor connected to an external IC to satisfy a prescribed specification.

SUMMARY OF THE INVENTION

One object of the present invention is to improve reliability of a semiconductor device which can be connected to an analog IC driven by a high power supply voltage and which comprises a field effect transistor driven by a low power supply voltage.

Another object of the present invention is to increase a surge breakdown voltage of a field effect transistor connected to an external analog IC driven by a high power supply voltage in a semiconductor device.

Yet another object of the present invention is to increase a drain breakdown voltage of a field effect transistor connected to an external analog IC driven by a high power supply voltage in a semiconductor device.

Still another object of the present invention is to provide a semiconductor device having field effect transistors of the same conductivity type having two types of surge breakdown voltages.

Another object of the present invention is to manufacture a semiconductor device of which reliability is improved.

Yet another object of the present invention is to manufacture a semiconductor device having a field effect transistor connected to an external analog IC driven by a high power supply voltage and having an increased surge breakdown voltage.

Another object of the present invention is to manufacture a semiconductor device having a field effect transistor connected to an external analog IC driven by a high power supply voltage and having an increased drain breakdown voltage.

Yet another object of the present invention is to manufacture a semiconductor device having field effect transistors of the same conductivity type having two types of surge breakdown voltages.

A semiconductor device according to one aspect of the present invention includes a semiconductor region of a first type conductivity and first and second field effect transistors formed in the semiconductor region. The first field effect transistor includes first and second impurity regions of a second type conductivity and a first electrode. First and second impurity regions are formed to be spaced apart from each other in the semiconductor region. A first gate electrode is formed between first and second impurity regions on the semiconductor region with an insulating film interposed to surround the first impurity region. At least the first impurity region includes a first low concentration region and a first high concentration region. The low concentration region is formed in the vicinity of the first gate electrode and has a first impurity concentration. The first high concentration region formed in a region apart from the first gate electrode connects with the first low concentration region and has a second impurity concentration which is higher than the first impurity concentration. The second field effect transistor includes third and fourth impurity regions of the second type conductivity and a second gate electrode. Third and fourth impurity regions are formed to be spaced apart from each other in the semiconductor region. The second gate electrode is formed between third and fourth impurity regions on the semiconductor region with an insulating film interposed. At least the third impurity region includes a second low concentration region and a second high concentration region. The second low concentration region is formed in the vicinity of the second gate electrode and has a third impurity concentration which is lower than the first impurity concentration. The second high concentration region formed in a region apart from the second gate electrode connects with the second low concentration region and has a fourth impurity concentration which is higher than the third impurity concentration.

According to a manufacturing method of a semiconductor device according to another aspect of the present invention, a gate insulating film is formed on a semiconductor region of the first type conductivity. First and second regions are formed to be spaced apart from each other in the semiconductor region, and a first gate electrode is formed between first and second regions on the gate insulating film to surround the first region. A second gate electrode is formed between the third and the fourth region on the gate insulating film such that the third and fourth regions are formed to be spaced apart from each other in the semiconductor region. A first doping amount of impurities of the second type conductivity are selectively doped into the vicinity of the first gate electrode of at least the first region, so that a first low concentration region is formed. Second type conductivity impurities of a second doping amount which is smaller than the first doping amount are selectively doped into the vicinity of the second gate electrode of at least the third region, so that a second low concentration region is formed. Second type conductivity impurities of a third doping amount which is larger than the first doping amount are selectively doped into the first region apart from the first gate electrode and connecting with the first low concentration region, so that a first high concentration region is formed. Second type conductivity impurities of a fourth doping amount which is larger than the second doping amount are selectively doped into the third region apart from the second gate electrode and connecting with the second low concentration region, so that a second high concentration region is formed.

In a semiconductor device of the present invention, at least a first impurity region of a first field effect transistor includes a first low concentration region and a first high concentration region. At least a third impurity region of a second field effect transistor includes a second low concentration region and a second high concentration region. An impurity concentration of the first low concentration region is higher than an impurity concentration of the second low concentration region. Thus, in two field effect transistors of the same type conductivity constituting a semiconductor device, impurity concentrations of low concentration regions of an LDD structure are made different. As a result, the first field effect transistor of an LDD structure having low concentration regions whose impurity concentration is high can be provided with a surge breakdown voltage higher than that of the second field effect transistor. Hence, by employing the first field effect transistor as an open-drain-transistor to which an external surge is directly applied, reliability of the semiconductor device can be enhanced.

In a semiconductor device of the present invention, a first gate electrode of a first field effect transistor is formed to surround a first impurity region, so that the first impurity region is not in contact with an inversion preventing region of an isolation region, but in contact with only a channel region under the gate electrode. As a result, a drain breakdown voltage of a first field effect transistor can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be described with reference to the figures.

Figure 1:
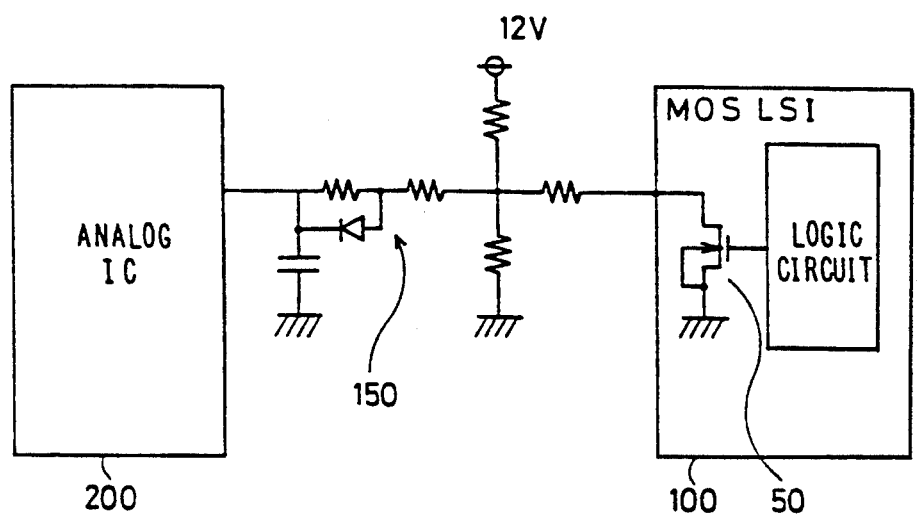
FIG. 1 is a block diagram showing a semiconductor device, according to one embodiment of the present invention, which is connected to an analog IC.

Referring to FIG. 1, an MOS type LSI 100 is connected to an analog IC 200 through an integrating circuit 150. A logic circuit of MOS type LSI 100 is connected to integrating circuit 150 through an n channel-open-drain-transistor 50. The gate of n channel-open-drain-transistor 50 receives a signal ("high" or "low") output from the logic circuit. N channel-open-drain-transistor 50 is turned on and off in response to the signal from the logic circuit. Depending on a time ratio of on to off, a voltage of not more than 12V is successively input to analog IC 200. Analog IC 200 shown in FIG. 1 is used to control sound volume or the like.

Figure 2:
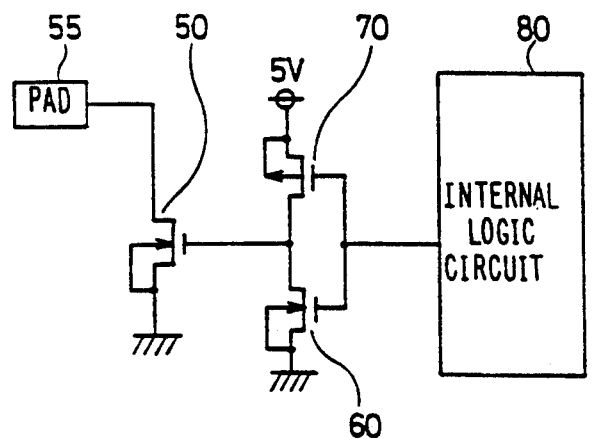
FIG. 2 is a block diagram showing a schematic structure of a semiconductor device according to the embodiment of the present invention.

As shown in FIG. 2, analog IC 200 of FIG. 1 is connected to pad 55. Pad 55 is connected to the drain of n channel-open-drain-transistor 50. Also, a signal output from a CMOS inverter comprised of, for example, an n channel MOS transistor 60 and a p channel MOS transistor 70 is applied to the gate of n channel-open-drain-transistor 50. In this case, a signal from internal logic circuit 80 is input to the CMOS inverter.

Figure 3:
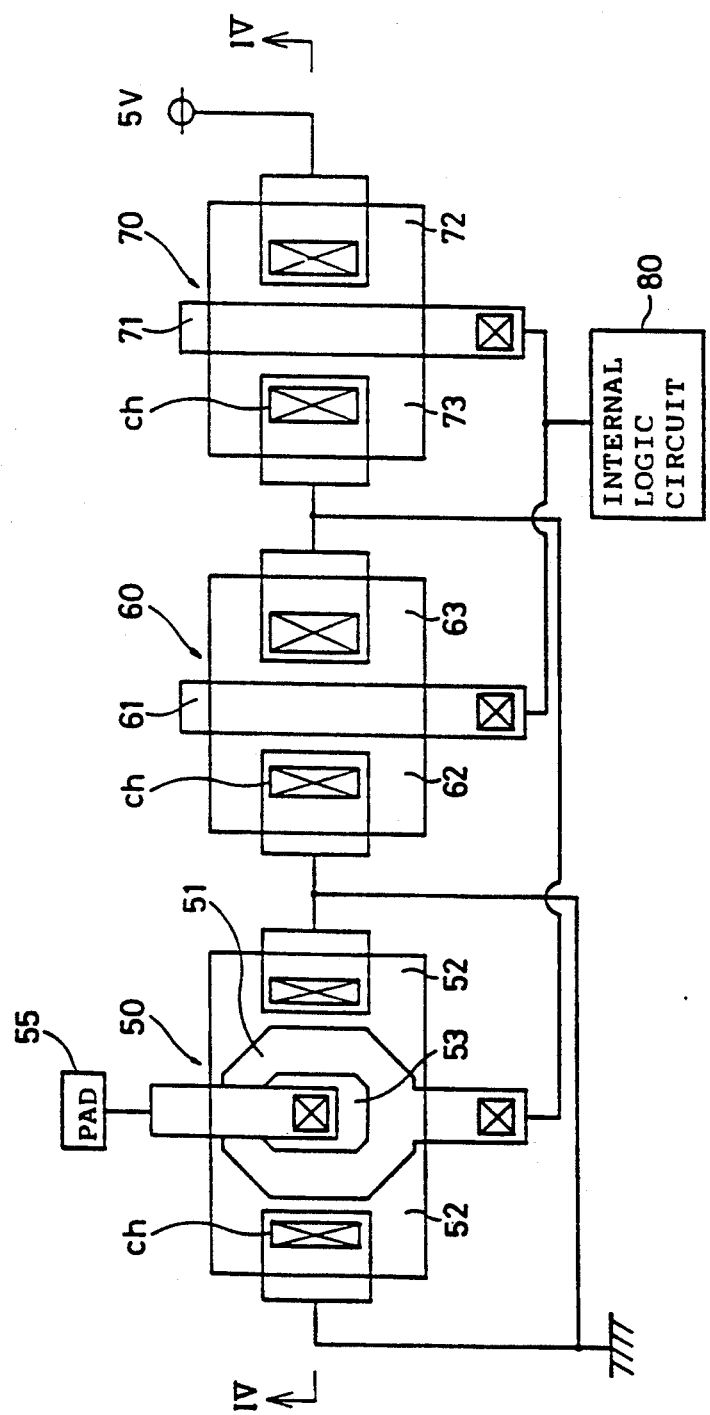
FIG. 3 is a plan view showing a planar arrangement of a semiconductor device according to the embodiment of the present invention.

As shown in FIG. 3, n channel-open-drain-transistor 50 includes a gate electrode 51, a source region 52 and a drain region 53. Gate electrode 51 is formed to surround drain region 53. Source region 52 is formed in a region surrounding the ring-shaped gate electrode 51. Pad 55 as a connecting terminal of analog IC is interconnected to drain region 53 through a contact hole ch. N channel MOS transistor 60 includes a gate electrode 61, a source region 62 and a drain region 63. P channel MOS transistor 70 includes a gate electrode 71, a source region 72 and a drain region 73. A potential of source regions 52 and 62 of n channel MOS transistor 60 and n channel-open-drain-transistor 50 is held at a ground potential. A potential of source region 72 of p channel MOS transistor 70 is held at a power supply potential (5V).

Figure 4:
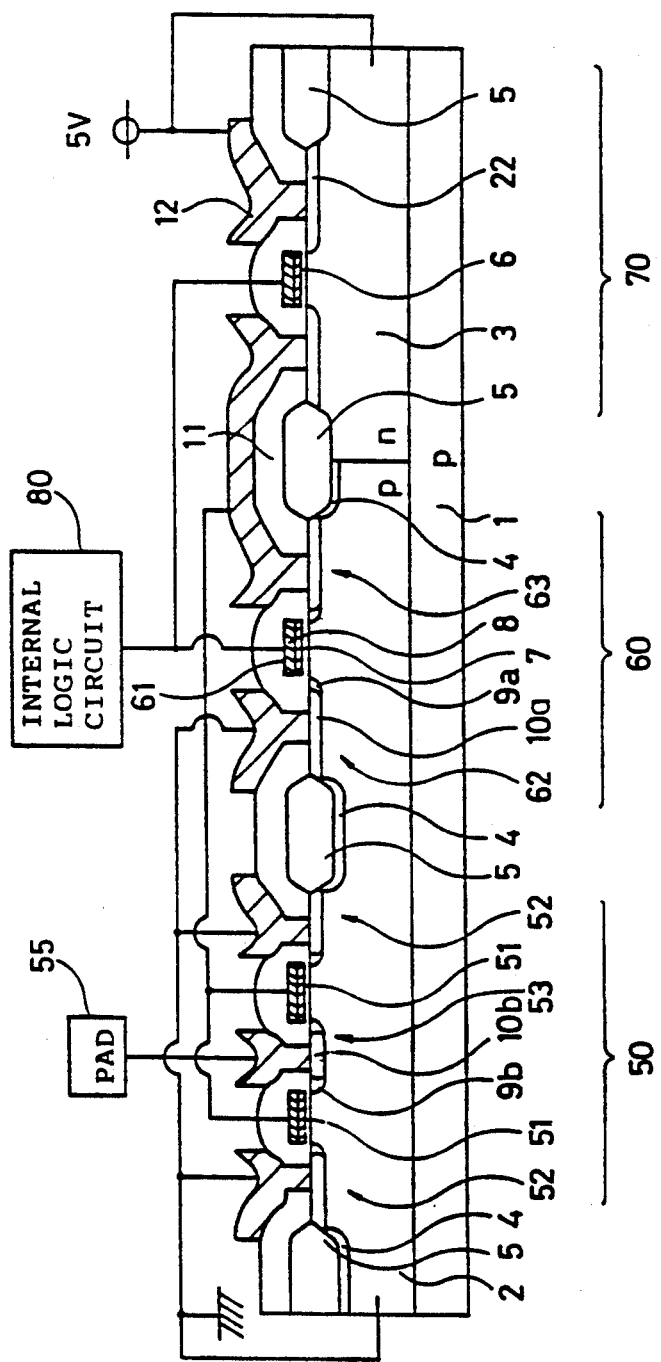
FIG. 4 is a sectional view taken along a line IV—IV of FIG. 3.

Referring to FIG. 4, each of transistors 50, 60, 70 is formed in the same p type silicon substrate 1. P type well 2 and n type well 3 are formed in p type silicon substrate 1. N channel-open-drain-transistor 50 and n channel MOS transistor 60 are formed in p type well 2. P channel MOS transistor 70 is formed in n type well 3. A gate electrode of each of transistors 50, 60, 70 has a two-layer structure formed of a polycrystalline silicon layer 7 and molybdenum silicide layer 8 doped with n type impurities. Each gate electrode is formed on p type well 2 or n type well 3 with a gate oxide film 6 interposed.

Referring to FIGS. 3 and 4, source/drain regions 52, 53 of n channel-open-drain-transistor 50 has an LDD structure formed of n⁻ source/drain region 9b and n+ source/drain region 10b. Source/drain regions 62, 63 of n channel MOS transistor 60 have an LDD structure formed of n⁻ source/drain region 9a and n+ source/drain region 10a. The impurity concentration of n⁻ source/drain region 9b is higher than the impurity concentration of n⁻ source/drain region 9a. As a result, even if an external surge is directly applied to drain region 53 through pad 55, a surge breakdown does not occur easily. That is, compared to n channel MOS transistor 60, n channel-open-drain-transistor 50 has a higher surge breakdown voltage.

Drain region 53 of n channel-open-drain-transistor 50 is surrounded by a ring-shaped gate electrode 51, so that drain region 53 is not in contact with a p+ inversion preventing region 4 formed under an isolation oxide film 5. Consequently, a drain breakdown voltage of n channel-open-drain-transistor 50 is higher than that of n channel MOS transistor 60. That is, as shown in FIGS. 1 and 2, it is possible to allow a larger margin in a breakdown voltage specification for a power supply (a voltage of 12V) connected to the drain of n channel-open-drain-transistor 50 through pad 55.

Figure 5:
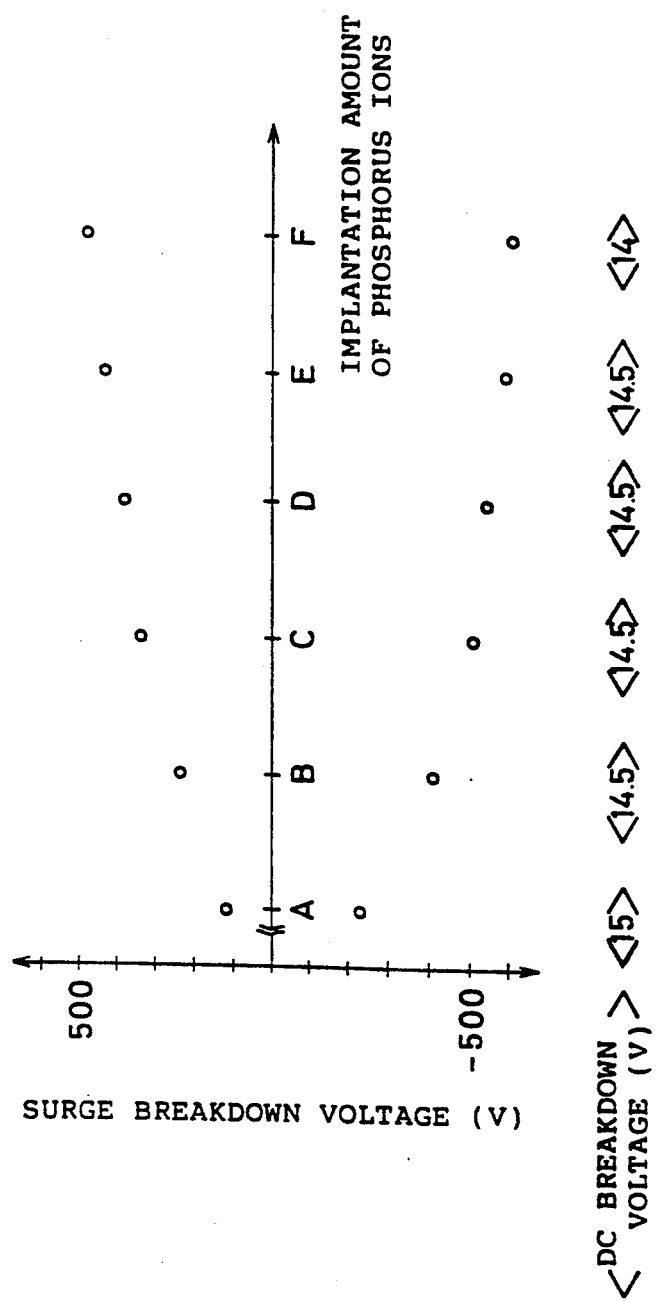
FIG. 5 is a graph showing a relationship between a surge breakdown voltage of an n channel MOS transistor employed in a semiconductor device of the present invention and an implantation amount of phosphorus ions in an n⁻ region.

FIG. 5 is a graph showing a relationship of a surge breakdown voltage of n channel-open-drain-transistor 50 in a semiconductor device of the present invention and implantation amounts of phosphorus ions based on measured results. A surge breakdown voltage is measured for both positive and negative surges. Implantation amounts of phosphorus ions (/cm²) are $A = 3 \times 10^{13}$, $B = 5 \times 10^{13}$, $C = 6.5 \times 10^{13}$, $D = 8.5 \times 10^{13}$, $E = 1 \times 10^{14}$, $F = 2 \times 10^{14}$. A surge breakdown voltage is measured using a capacitor charging method on condition of 200 pF and 0Ω. DC breakdown voltages are indexes of a drain breakdown voltage. DC breakdown voltages are drain voltages when a drain current $I_{DS}$ is 0.1 μA with a potential of a source, a substrate region and a gate being held at a ground potential. Implantation amounts of phosphorus ions in the graph are amounts of phosphorus ions implanted into n⁻ region 9b in drain region 53 of n channel-open-drain-transistor 50 shown in FIGS. 3 and 4. A silicon oxide film formed on a sidewall of gate electrode 51 is formed of a TEOS film.

As can be clearly seen from FIG. 5, when an impurity concentration of n⁻ region 9b is high, a surge breakdown voltage of not less than ±300V can be obtained. A DC breakdown voltage is in the range of 14.5V (average value). A measured DC breakdown voltage of an n channel MOS transistor having a non-ring-shaped gate electrode as n channel MOS transistor 60 is, for comparison, 13.5V (average value).

As described above, even when a sidewall oxide film, such as a TEOS film, in which a density of trapped carriers is high, a surge breakdown voltage of not less than 300V can be also obtained. Also, by forming a ring-shaped gate electrode, a larger margin for a power supply voltage (12V) can be given to a DC breakdown voltage, that is, a drain breakdown voltage.

Figure 23:
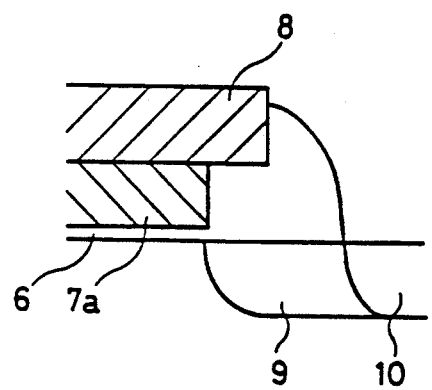
FIG. 23 is a partial sectional view showing a side-etched sidewall portion of a gate electrode in the conventional semiconductor device.
Figure 24:
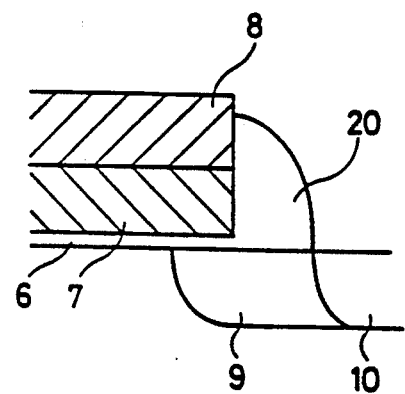
FIG. 24 is a partial sectional view showing a sidewall portion of the gate electrode in the conventional semiconductor device.
Figure 25A:
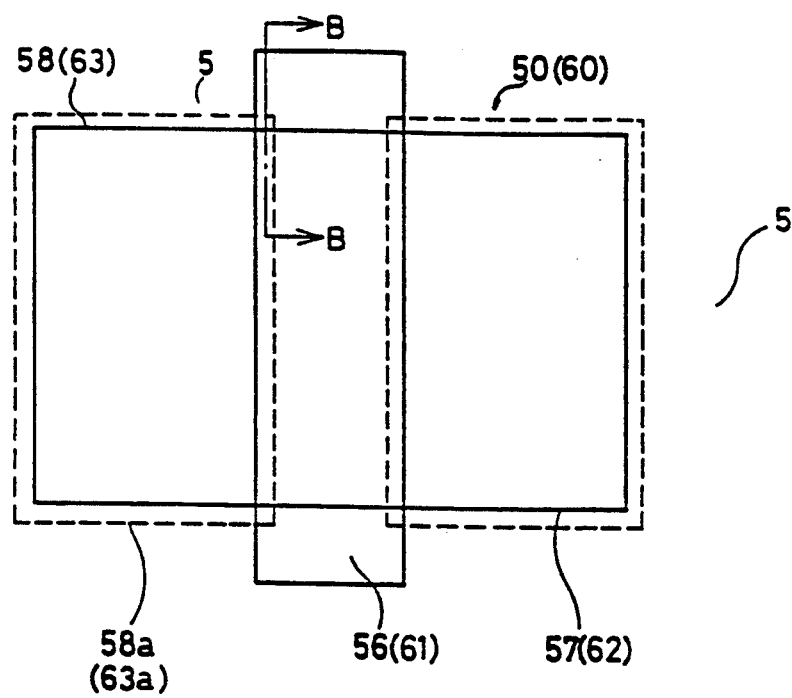
FIG. 25 includes a partial plan view (A) showing an enlargement of the n channel transistor of FIG. 21, and a partial sectional view (B) showing a section taken along line B—B of FIG. 25(A).
Figure 25B:
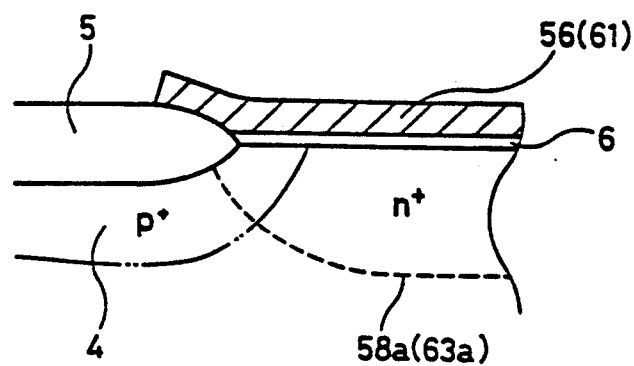

As shown in FIG. 5, by setting the impurity concentration of n⁻ region higher, a surge breakdown voltage can be increased, so that, for example, even when a lower layer forming a gate electrode is side-etched as shown in FIG. 23, a surge breakdown voltage can be increased so sufficiently as to prevent its influence.

Although, in the above embodiment, the application of the present invention to an open-drain-transistor of n channel type was described, the present invention can be similarly applied to an open-drain-transistor of p channel type. Also, the gate electrode has a two-layer structure of the polycrystalline silicon layer and the molybdenum silicide layer; however, the present invention can be similarly applied to a two-layer structure of a polycrystalline silicon layer and a tungsten silicide layer, a single-layer structure of, for example, tungsten, or the like. Furthermore, in the above embodiment, an LDD structure is used for both source and drain regions; however, the effect of the present invention can be obtained if the LDD structure is used only for a drain region.

One embodiment of a manufacturing method of a semiconductor device of the present invention will be described.

Figure 6:
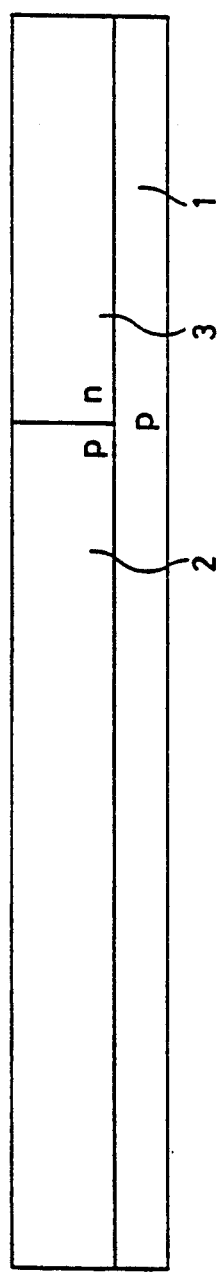
FIG. 6 through FIG. 18 are sectional views successively showing respective steps of a manufacturing method of a semiconductor device according to the embodiment of the present invention.

Referring to FIG. 6, p type well 2 and n type well 3 are formed on p type silicon substrate 1.

Figure 7:
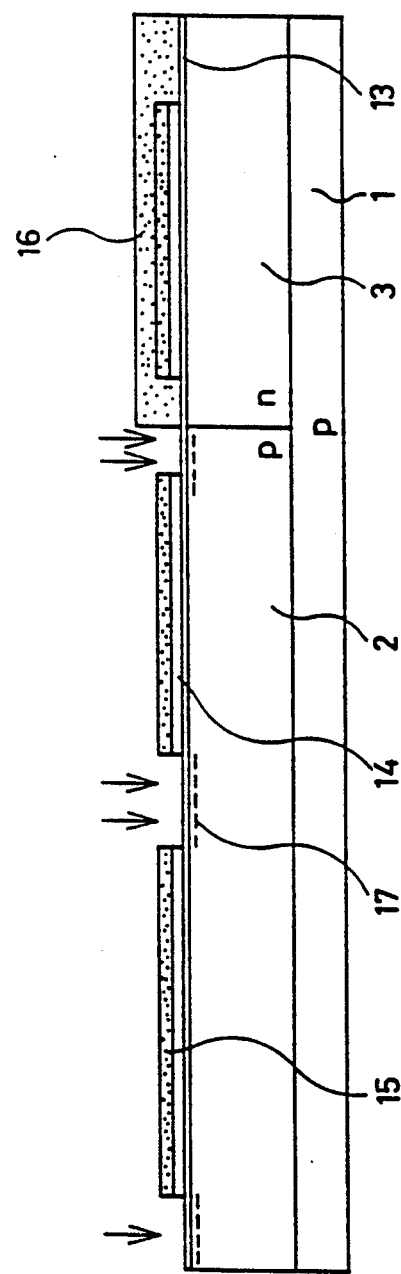

Referring to FIG. 7, on the whole surfaces of p type well 2 and n type well 3, oxide film 13 is formed. A resist film 15 and a nitride film 14 which are patterned to expose surfaces of only isolation regions are formed on oxide film 13. A resist film 16 is formed on n type well 3. Using resist films 15 and 16 as masks, boron is implanted into p type well 2 as indicated by the arrows.

Figure 8:
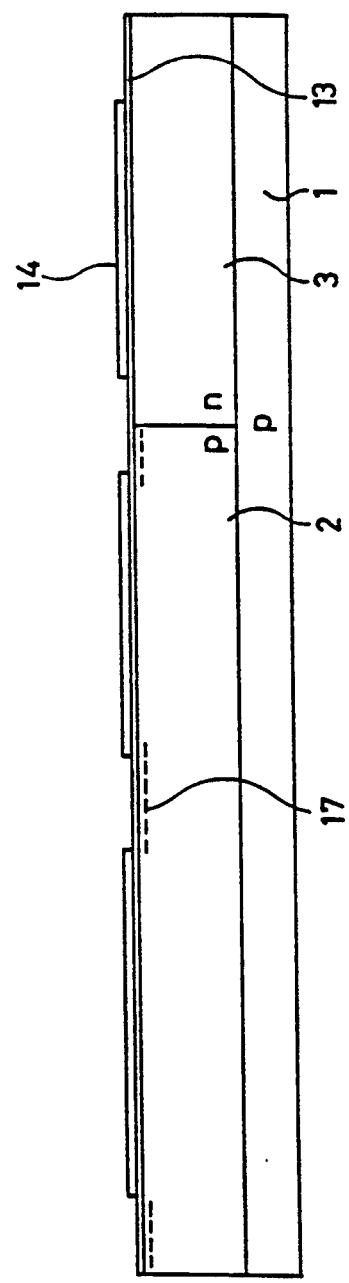

Referring to FIG. 8, resist films 15 and 16 are removed. A boron ion implantation region 17 is formed in p type well 2. Thereafter, a thermal oxidation process is carried out.

Figure 9:
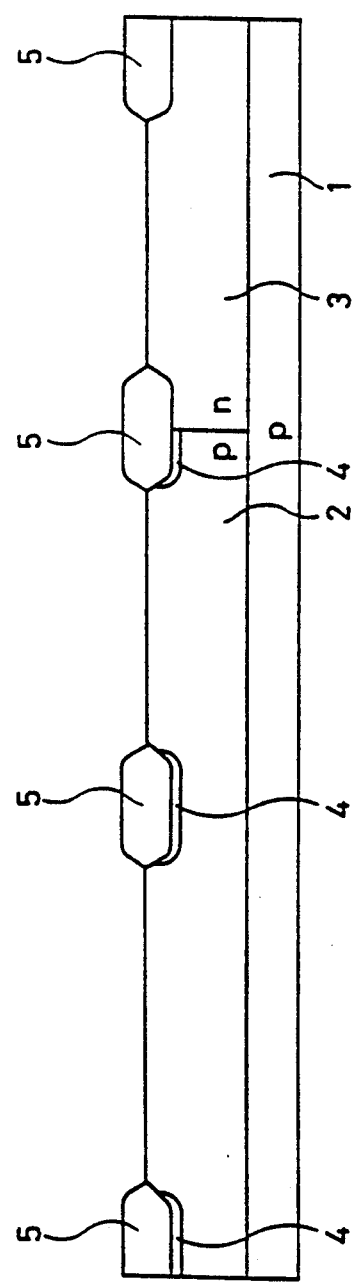

Consequently, a thick isolation oxide films 5 are formed as shown in FIG. 9. P+ inversion preventing regions 4 are formed under isolation oxide films 5.

Figure 10:
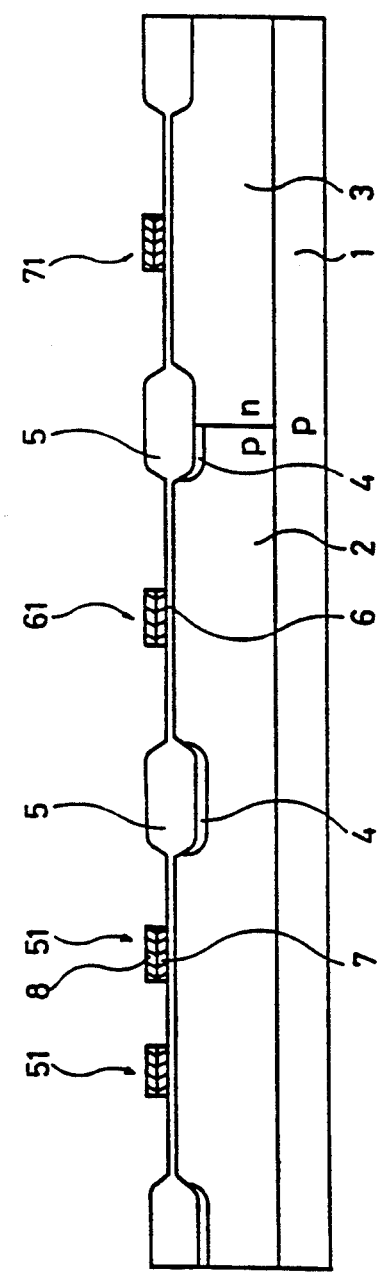

As shown in FIG. 10, gate oxide film 6 is formed in a thickness of 250 Å by a thermal oxidation method. On gate oxide film 6, a polycrystalline silicon layer is formed in a thickness of 280 Å using a CVD method. Phosphorus is doped into the polycrystalline silicon layer, and a polycrystalline silicon layer of n type is formed. On the n type polycrystalline silicon layer, a molybdenum silicide layer is formed in a thickness of 2300 Å by a sputtering method. Thereafter, the patterning is carried out using photolithography and anisotropic etching, and gate electrodes 51, 61, 71 of a two-layer structure comprised of polycrystalline silicon layer 7 and molybdenum silicide layer 8 are formed as shown in FIG. 10. In this case, a pattern of gate electrode 51 of the n channel-open-drain-transistor is a ring-like shape as shown in FIG. 3.

Figure 11:
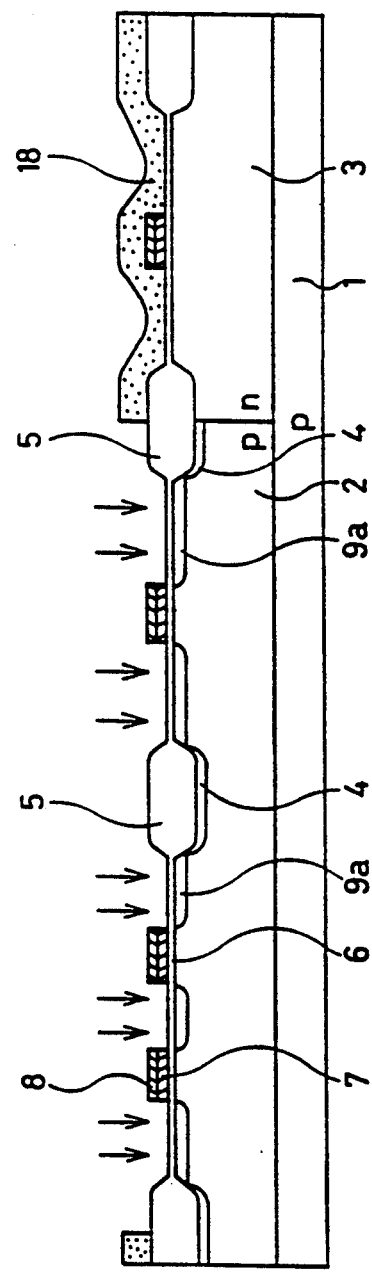

Thereafter, as shown in FIG. 11, a resist film 18 is formed according to a prescribed pattern. Using resist film 18 and molybdenum silicide layer 8 as masks, phosphorus ions are implanted into p type well 2, as indicated by the arrows, on condition that an acceleration voltage is 50 kV and that an implantation amount is $3.0\times10^{13}/cm^2$. $n^-$ source/drain region 9a is then formed.

Figure 12:
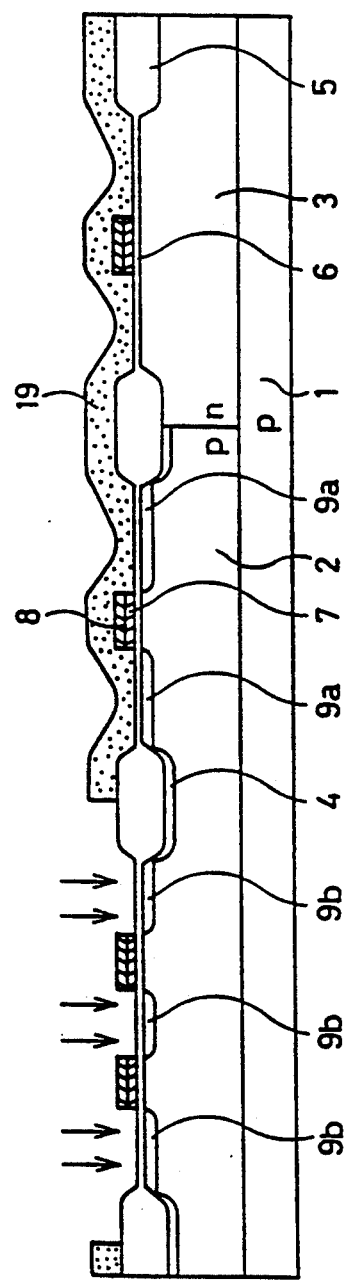

As shown in FIG. 12, a resist film 19 is formed to expose only a formation region of the n channel-open-drain-transistor. Using resist film 19 and molybdenum silicide layer 8 as masks, phosphorus ions are implanted into only source/drain regions of the n channel-open-drain-transistor on condition that an acceleration voltage is 50 kV and that an implantation amount is $7.0\times10^{13}cm^2$, whereby $n^-$ source/drain regions 9b having a relatively high concentration are formed.

Figure 13:
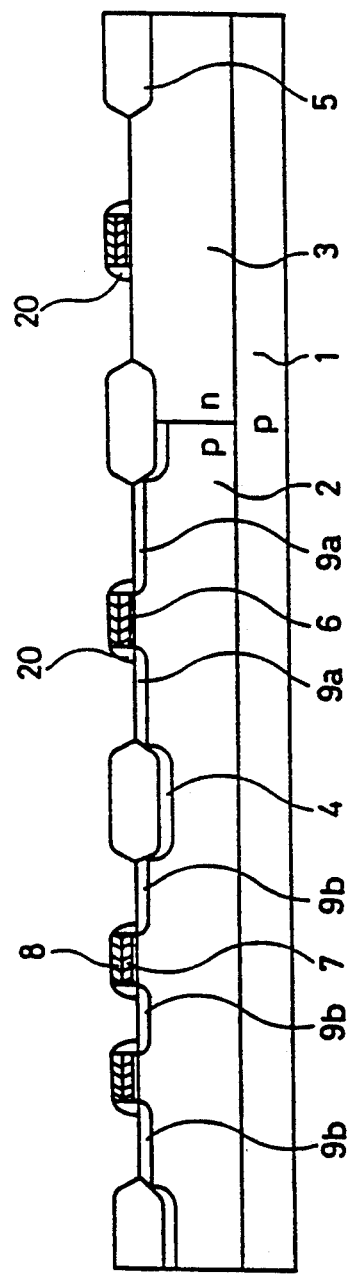

Thereafter, a silicon oxide film, for example, a TEOS film is formed on the whole surface in a thickness of 3000 Å using a CVD method. The silicon oxide film is subjected to an anisotropic etching process, and sidewall oxide films 20 are formed on sidewalls of polycrystalline silicon layer 7 and molybdenum silicide layer 8 as shown in FIG. 13.

Figure 14:
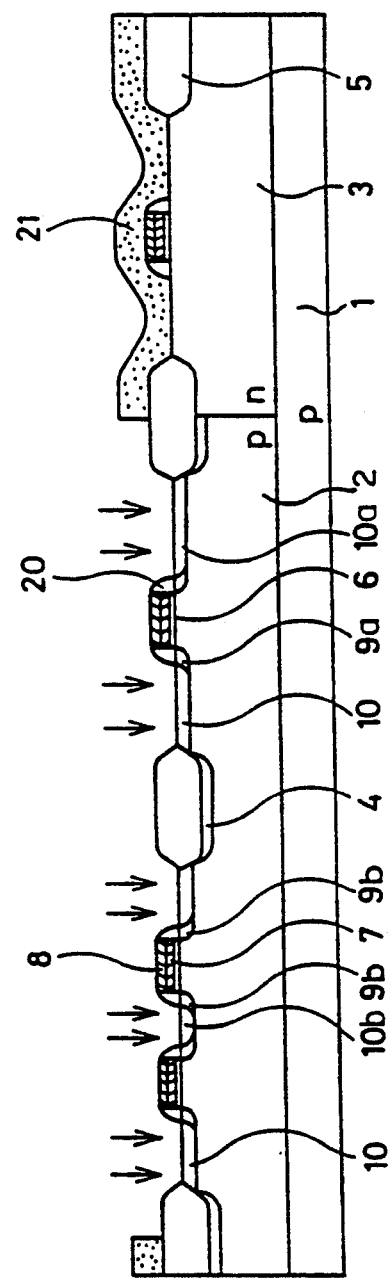

As shown in FIG. 14, a resist film 21 according to a prescribed pattern is formed. Using resist film 21 and sidewall oxide film 20 as masks, arsenic ions are implanted into p type well 2 on condition that an acceleration voltage is 50 kV and that an implantation amount is $4.0\times10^{15}/cm^2$, so that $n^+$ source/drain region 10 is formed.

Figure 15:
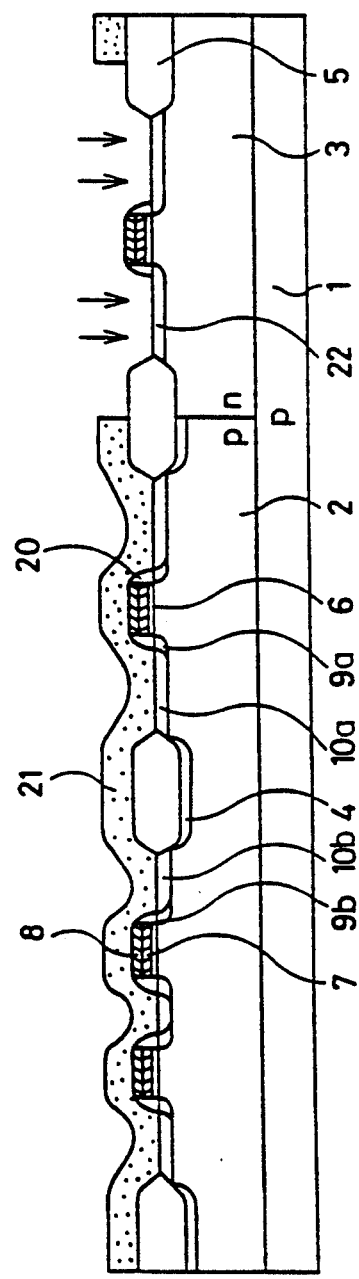

Thereafter as shown in FIG. 15, a resist film 21 is formed to expose only regions of n type well 3. Boron ions are implanted into n type well 3 on condition that an acceleration voltage is 300 kV and that an implantation amount is $1.2\times10^{15}/cm^2$, as indicated by the arrows, so that $p^+$ source/drain region 22 is formed.

Figure 16:
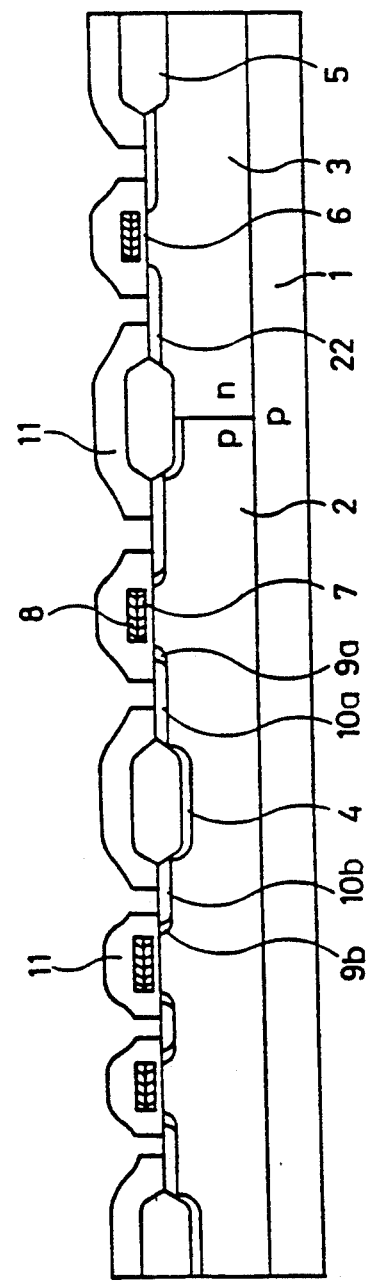

As shown in FIG. 16, after heat treatment is carried out to activate a region where the impurity ions are implanted, an interlayer insulating film 11 of a BPSG (Borophosphosilicate glass) film is formed in a thickness of 10000 Å. Contact holes are formed in interlayer insulating layer 11 using photolithography and anisotropic etching.

Figure 17:
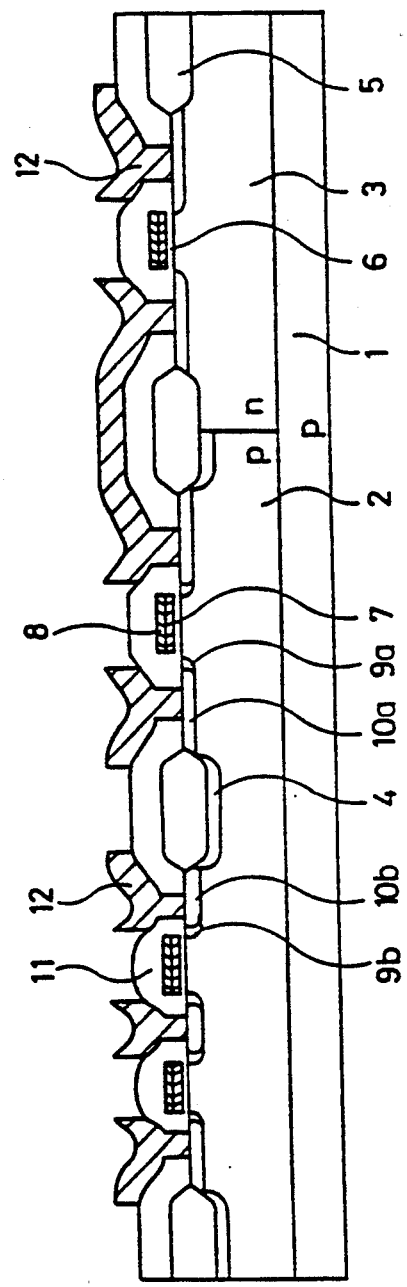

As shown in FIG. 17, interconnection layer 12 of aluminum-silicon is formed in a thickness of 8500 Å using a sputtering method so as to be in contact with respective source/drain regions through respective contact holes.

Figure 18:
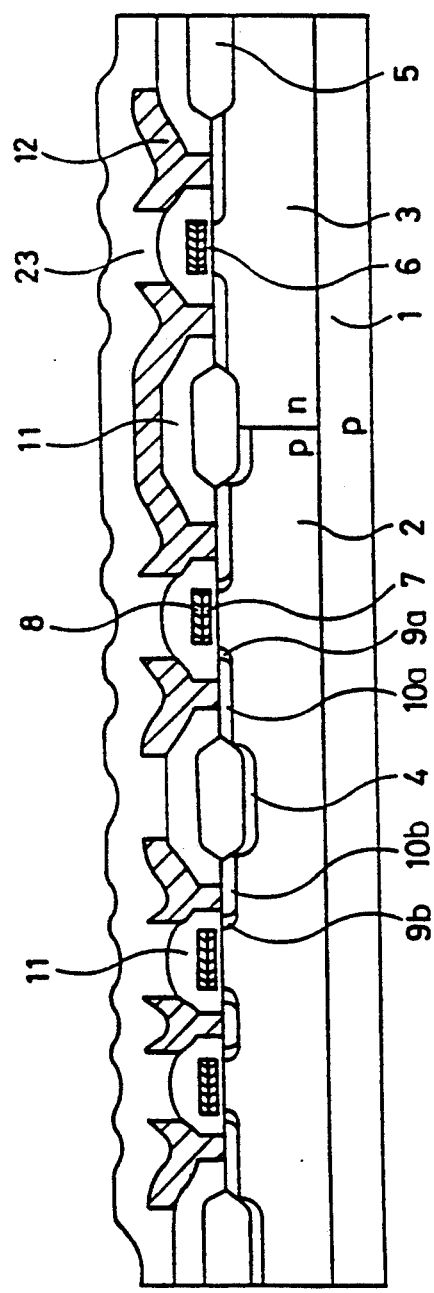

As shown in FIG. 18 a protecting film 23 of $Si_3N_4$ or the like is formed in a thickness of 7500 Å to cover the whole surface. Thereafter, holes reaching surfaces of interconnection layer 12 are formed in protecting film 23 for connection to external leads using photolithography and etching. Pad portions of aluminum-silicon alloy are formed to connect with interconnection layer 12 through the holes. Thus the semiconductor device of the present invention is manufactured.

Figure 19:
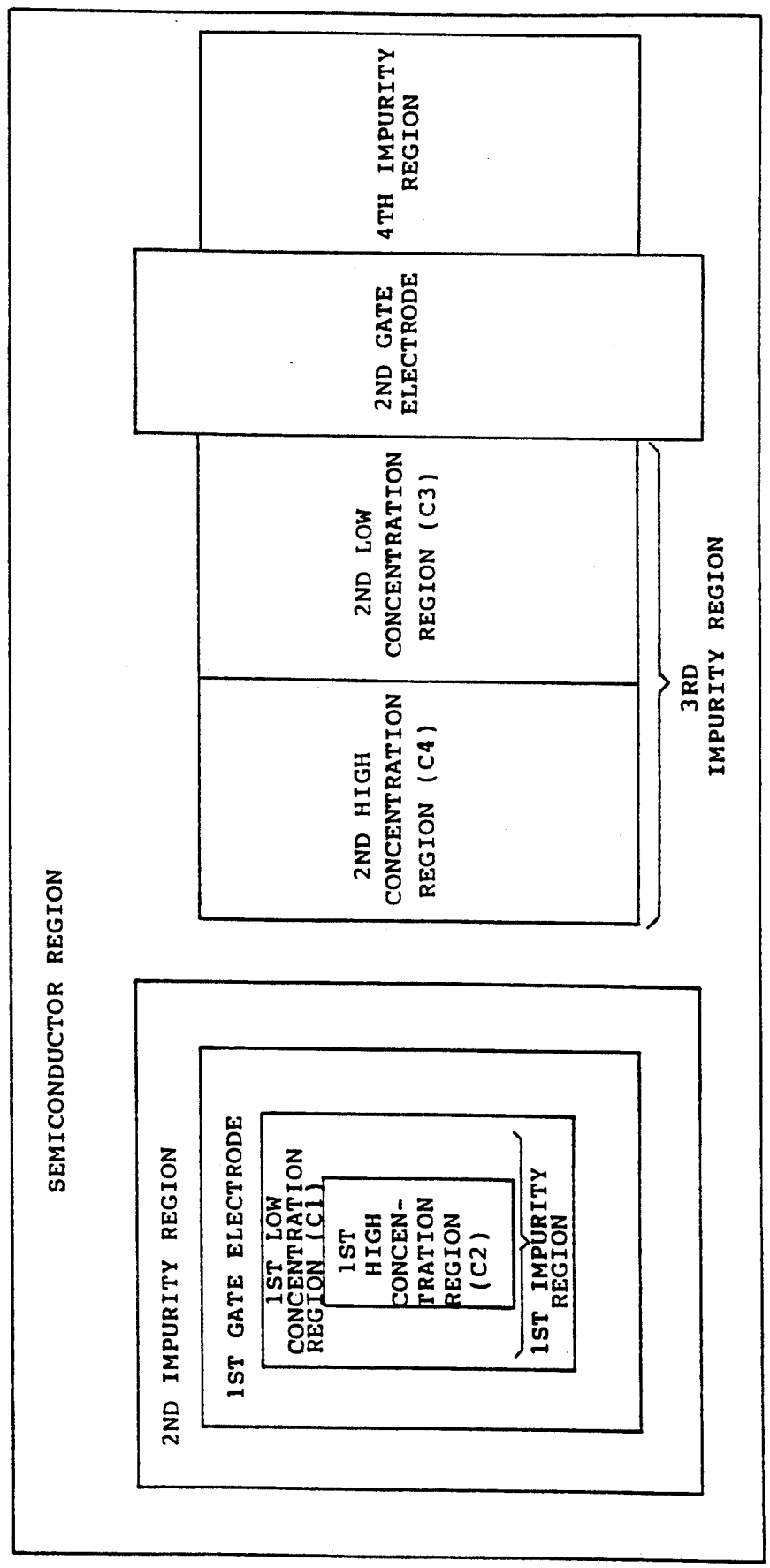
FIG. 19 is a conceptual diagram showing a structure of a semiconductor device according to the present invention.
Figure 20:
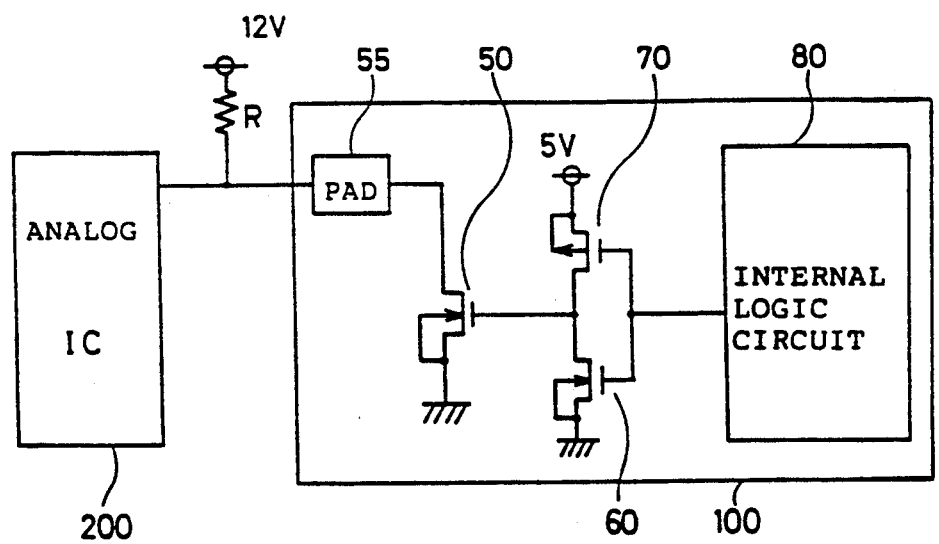
FIG. 20 is a block diagram showing a conventional semiconductor device connected to an analog IC.
Figure 21:
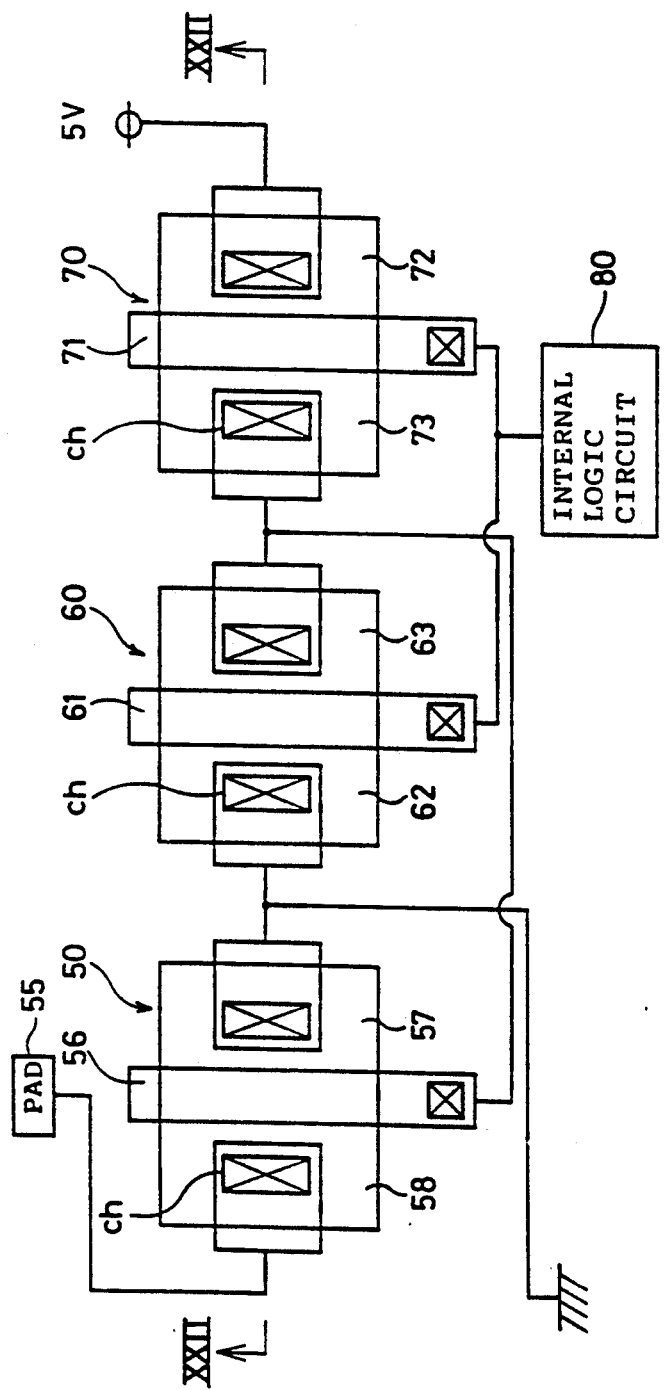
FIG. 21 is a plan view showing a planar arrangement of the conventional semiconductor device.
Figure 22:
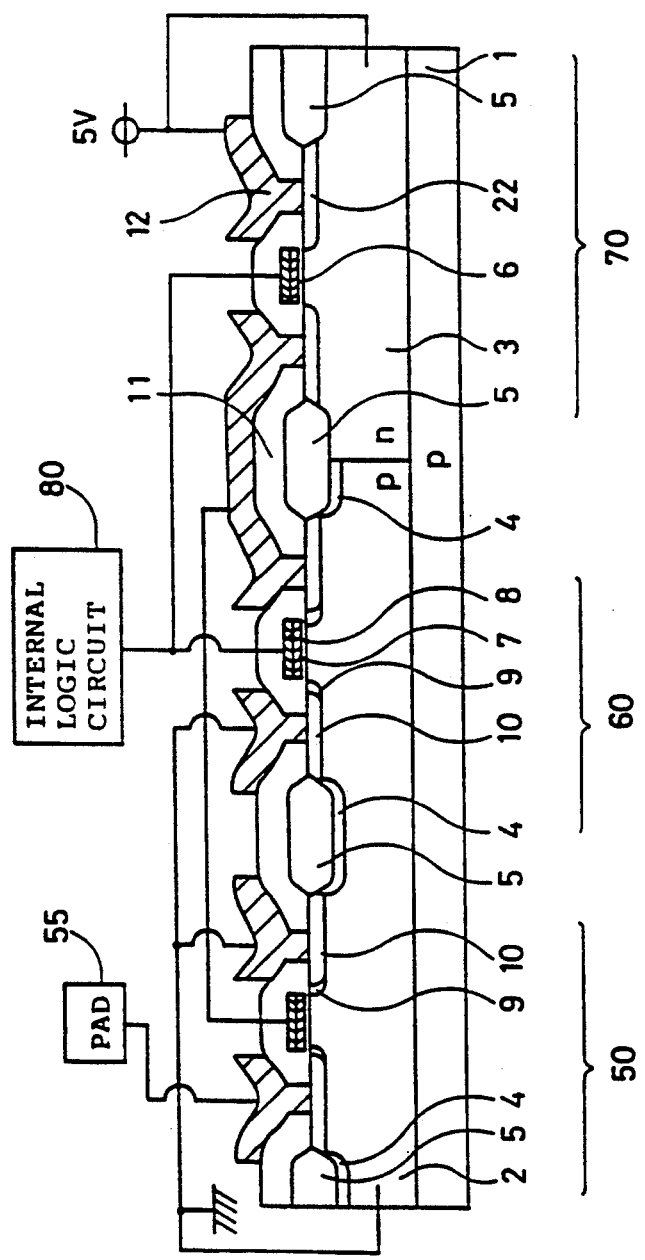
FIG. 22 is a sectional view taken along a line XXII—XXII in FIG. 21.

Concept of the structure of the semiconductor device according to the present invention is shown in FIG. 19. In FIG. 19, $C_1$, $C_2$, $C_3$ and $C_4$ denote impurity concentrations of a first low concentration region, a first high concentration region, a second low concentration region and a second high concentration region, respectively.

As described above, according to the present invention, it is possible to increase a surge breakdown voltage by setting a concentration of impurity regions of a low concentration relatively high in an LDD structure of one of two field effect transistors of the same type conductivity. Also, a gate electrode is formed to surround one of impurity regions of one of the field effect transistors, so that a drain breakdown voltage can be increased. And hence, reliability of a semiconductor device can be enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an output transistor having a high breakdown voltage, comprising:
    a semiconductor substrate having a main surface;
    a semiconductor region of a first type conductivity having a first element forming region and a second element forming region separated by a field isolating oxide, the main surface of said semiconductor substrate being substantially planar throughout said first and second element forming regions;
    a first field effect transistor formed in said first element forming region; and
    a second field effect transistor formed in said second element forming region;
        said first field effect transistor including:
            (i) first and second impurity regions of a second type conductivity formed spaced apart on the main surface of said semiconductor substrate, and
            (ii) a first gate electrode formed between said first and second impurity region on said main surface of said semiconductor substrate through an insulating film, said first gate electrode circumscribing said first impurity region, wherein
            at least said first impurity region includes a first low concentration region formed adjacent said first gate electrode and having a first impurity concentration, and a first high concentration region formed in a distal region apart form said first gate electrode, said first high concentration region formed in contact with said first low concentration region, and having a second impurity concentration which is higher than said first impurity concentration, said second field effect transistor Including:
            (i) third and fourth impurity regions of the second type conductivity formed spaced apart on the main surface of said semiconductor substrate, and
            (ii) a second gate electrode formed between said third and fourth impurity region on said main surface of said semiconductor substrate through an insulating film, said second gate electrode having a substantially rectangular shape, wherein
            at least said third impurity region includes a second low concentration region formed adjacent said second gate electrode and having a third impurity concentration which is lower than said first impurity concentration, and a second high concentration region formed in a distal region apart from said second gate electrode connecting with said second low concentration region and having a fourth impurity concentration which is higher than said third impurity region.

2. The semiconductor device according to claim 1, wherein said first gate electrode is ring-shaped to surround said first impurity region.

3. The semiconductor device according to claim 1, further comprising a semiconductor region of the second type conductivity.

4. The semiconductor device according to claim 3, further comprising a semiconductor region of the second type conductivity, and a third field effect transistor formed in said semiconductor region of the second type conductivity; wherein
    said third field effect transistor comprises
        fifth and sixth impurity regions of the first type conductivity formed spaced apart from each other on said main surface of said semiconductor substrate, and
        a third gate electrode formed between said fifth and sixth impurity region through an insulating film on said main surface of said semiconductor substrate.

5. The semiconductor device according to claim 4, wherein
    said first impurity region is connected to an analog IC, said second impurity region and said fourth impurity region are connected to a first power supply potential, said first gate electrode, said third impurity region and said fifth impurity region are connected to one another, said sixth impurity region is connected to a second power supply potential, and said second gate electrode and said third gate electrode are connected to an internal logic circuit.

6. The semiconductor device according to claim 1, wherein said second impurity region surrounds said first gate electrode.

7. A semiconductor device comprising:
    a semiconductor substrate having a main surface;
    a semiconductor region of a first type conductivity having a first element forming region and a second element forming region separated by a field isolating oxide, the main surface of said semiconductor substrate being substantially planar throughout said first and second element forming regions;
    a first field effect transistor formed in said first element forming region; and
    a second field effect transistor formed in said second element forming region;
    said first field effect transistor including:
        (i) first and second impurity regions of a second type conductivity formed spaced apart on the main surface of said semiconductor substrate, and
        (ii) a first gate electrode formed between said first and second impurity region on said main surface of said semiconductor substrate through an insulating film, said first gate electrode circumscribing said first impurity region, wherein
    said first impurity region has a first low concentration, said second field effect transistor including:
        (i) third and fourth impurity regions of the second type conductivity formed spaced apart on the main surface of said semiconductor substrate, and
        (ii) a second gate electrode formed between said third and fourth impurity regions on said main surface of said semiconductor substrate through an insulating film,
    said third impurity region has a second impurity concentration which is lower than said first low concentration.

* * * * *